United States Patent
Sinke

(10) Patent No.: US 7,109,498 B2
(45) Date of Patent: Sep. 19, 2006

(54) RADIATION SOURCE, LITHOGRAPHIC APPARATUS, AND DEVICE MANUFACTURING METHOD

(75) Inventor: Arnold Sinke, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/953,472

(22) Filed: Sep. 30, 2004

(65) Prior Publication Data

US 2005/0116183 A1   Jun. 2, 2005

(30) Foreign Application Priority Data

Oct. 9, 2003 (EP) .................... 03256370

(51) Int. Cl.
*G21G 5/00* (2006.01)

(52) U.S. Cl. ............... 250/492.2; 250/492.1; 250/396 R; 430/5; 430/395; 359/291; 359/290; 355/67; 355/53

(58) Field of Classification Search ............ None
See application file for complete search history.

(56) References Cited

U.S. PATENT DOCUMENTS

| | | | |
|---|---|---|---|
| 5,051,738 A * | 9/1991 | Tanielian et al. ............. 345/82 |
| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,111,271 A | 8/2000 | Snyman et al. |
| 6,133,986 A | 10/2000 | Johnson |
| 6,177,980 B1 | 1/2001 | Johnson |
| 6,262,845 B1 | 7/2001 | Sweatt |
| 6,365,951 B1 * | 4/2002 | Worley ...................... 257/438 |

(Continued)

FOREIGN PATENT DOCUMENTS

EP   1 231 514 A1   8/2002

(Continued)

OTHER PUBLICATIONS

English-language Abstract of JP 01-179581, published Jul. 17, 1989, 1 page.

(Continued)

*Primary Examiner*—John R. Lee
*Assistant Examiner*—Zia R. Hashmi
(74) *Attorney, Agent, or Firm*—Sterne, Kessler, Goldstein & Fox P.L.L.C.

(57) ABSTRACT

A radiation source for use in lithography. The radiation source comprising a pn-junction disposed on a substrate that can be reverse-biased to cause avalanche breakdown and emission of UV or DUV radiation by deceleration of electrons accelerated into an n-type region of the pn-junction. The radiation source can have a low operating voltage, a high switching speed, and provides great design freedom. High intensity can be provided, e.g., by the use of large or multiple sources. The pn-junction can be doped with impurities to increase emission of radiation at a desired frequency and increase the efficiency of the device. For protection, the pn-junction may be covered by a layer of transparent oxide. By reverse biasing the pn-junction with a potential difference at least 4V, radiation of wavelength 300 nm or less can be obtained. The pn-junction source of the present invention can replace conventional radiation sources and be using in connection with a mask/contrast device, or can be used to replace both the conventional radiation source and the mask/contrast device.

12 Claims, 2 Drawing Sheets

U.S. PATENT DOCUMENTS

| | | | |
|---|---|---|---|
| 6,608,360 B1 * | 8/2003 | Starikov et al. | ............ 257/481 |
| 6,687,041 B1 | 2/2004 | Sandstrom | |
| 6,747,783 B1 | 6/2004 | Sandstrom | |
| 6,795,169 B1 | 9/2004 | Tanaka et al. | |
| 6,806,897 B1 | 10/2004 | Kataoka et al. | |
| 6,811,953 B1 | 11/2004 | Hatada et al. | |
| 6,897,941 B1 | 5/2005 | Almogy | |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

| | | |
|---|---|---|
| JP | 5-136456 | 9/1993 |
| WO | WO 98/33096 | 7/1998 |
| WO | WO 98/38597 | 9/1998 |

OTHER PUBLICATIONS

N. Akil et al., Modeling of Light-Emission Spectra Measured on Silicon Nanometer-Scale Diode Antifuses, Aug. 15, 2000, pp. 1916-1922.

Intergrated Publishing, Special Devices, www.tpub.com/neets/book7/26.htm, pp. 1-9.

Copy of Partial European Search Report for European Appln. 03256370.2 dated Aug. 6, 2004, 12 pages.

Copy of European Search Report for European Appln. 03256370.2, dated Sep. 30, 2004, 7 pages.

English-language Abstract of JP 05-136456, published Jun. 1, 1993, 1 page.

* cited by examiner

RADIATION SOURCE, LITHOGRAPHIC APPARATUS, AND DEVICE MANUFACTURING METHOD

BACKGROUND OF THE INVENTION

1. Field of the Invention

The present invention relates to a radiation source, lithographic apparatus, and a device manufacturing method.

2. Related Art

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (resist). Instead of a mask, the patterning means may comprise an array of individually controllable elements that generate the circuit pattern on an impinging light beam.

In general, a single substrate will contain a network of adjacent target portions that are successively exposed. Lithographic apparatus include steppers, in which each target portion is irradiated by exposing an entire pattern onto the target portion in one pass, and scanners, in which each target portion is irradiated by scanning the pattern through the beam in a given direction (the "scanning"—direction), while synchronously scanning the substrate parallel or anti-parallel to this direction.

The size of features that can be imaged by a lithographic projection apparatus is limited by the wavelength of the radiation used. To image smaller features requires a shorter wavelength and so UV, deep UV (DUV) or extreme UV (EUV) radiation is used. The wavelengths that can be used are limited by the sources available, for example, HG vapor lamps for UV, excimer lasers for DUV, and plasma discharge sources for EUV. Semiconductor light sources, such as LEDs and laser diodes, are extremely efficient light sources that are in widespread use in many fields, but as yet there is no such device useful to provide exposure radiation for lithography.

The wavelength of the light output by most current LEDs is determined by the specific semiconductor band structure in the pn-junction. The application of an electrical supply to the junction causes electrons to be injected into the n-type region where they occupy the conduction band of this region (e.g., higher energy bands), as the valence band is full. As the occupancy of this band increases electrons will also be pushed into the conduction band of the p-type region. However, the valence band of the p-type region has some vacancies, so electrons will fall into these lower energy states, emitting light of frequency characteristic of the band-gap in the p-type region in order to conserve energy.

Another type of device produces radiation from a pn-junction using the avalanche effect. The avalanche effect is a process whereby a reverse bias is applied to a suitably doped pn-junction diode. Electrons tunnel across the forbidden depletion region and multiply rapidly, unless strictly controlled. The usual result is thermal emission in the infra-red region. Further information regarding such physical processes can be obtained from: www.tpub.com/neets/book7/26.htm, which is incorporated by reference herein in its entirety. Relevant information can also be found in "Light Emission In Silicon in the Visible Range From Nanoscale Diode Anti-fuses" by V E Houtsma et al., Proceedings from the 3rd International Workshop on Materials Science, which is incorporated by reference herein in its entirety. This discusses the use of reverse biasing to create avalanche breakdown and subsequent emission of visible light in pn-junctions.

Therefore, what is needed is a new radiation source that is useful in lithography, as well as, lithography apparatus and device manufacturing methods using the source.

SUMMARY

According to an embodiment of the invention, there is provided a radiation source for use in lithography. The radiation source comprises a pn-junction disposed on a substrate that can be reverse-biased to cause avalanche breakdown and emission of UV or DUV radiation by deceleration of electrons accelerated into the n-type region of the pn-junction.

This embodiment of the present invention also provides a lithographic apparatus arranged to transfer a pattern from a patterning device onto a substrate, the lithographic apparatus comprising a radiation source. The radiation source comprising a pn-junction disposed on a substrate that can be reverse-biased to cause avalanche breakdown and emission of UV or DUV radiation by deceleration of electrons accelerated into the n-type region of the pn-junction.

A further embodiment of the present invention provides a lithographic apparatus comprising an illumination system, a support structure, a substrate table, and a projection system. The illumination system provides a beam of radiation. The support structure supports a patterning device. The patterning device imparts the beam with a pattern in its cross-section. The substrate table holds a substrate. The projection system projects the patterned beam onto a target portion of the substrate. The illumination system comprises a radiation source and an illumination optical system arranged to project an image of the radiation source onto a pupil plane of the projection system. The support structure is arranged to support the patterning device at a plane that is a Fourier transform of the plane of the radiation source.

A still further embodiment of the present invention provides a lithographic apparatus comprising a radiation source, a substrate table, and a projection system. The radiation source serves as patterning means and comprises a plurality of selectively addressable elements, each element comprising a pn-junction disposed on a substrate that can be reverse-biased to cause avalanche breakdown and emission of UV or DUV radiation by deceleration of electrons accelerated into the n-type region of the pn-junction. The substrate table holds a substrate. The projection system projects an image of the radiation source onto a target portion of the substrate.

According to a still further embodiment of the invention, there is provided a device manufacturing method comprising projecting a patterned beam of radiation onto a substrate. The beam of radiation is generated by reverse-biasing a pn-junction disposed on a substrate to cause avalanche breakdown and emission of UV or DUV radiation by deceleration of electrons accelerated into the n-type region of the pn-junction to generate the beam.

BRIEF DESCRIPTION OF THE DRAWINGS

Embodiments of the invention will now be described, by way of example only, with reference to the accompanying schematic drawings in which corresponding reference symbols indicate corresponding parts.

DETAILED DESCRIPTION

Figure 1:
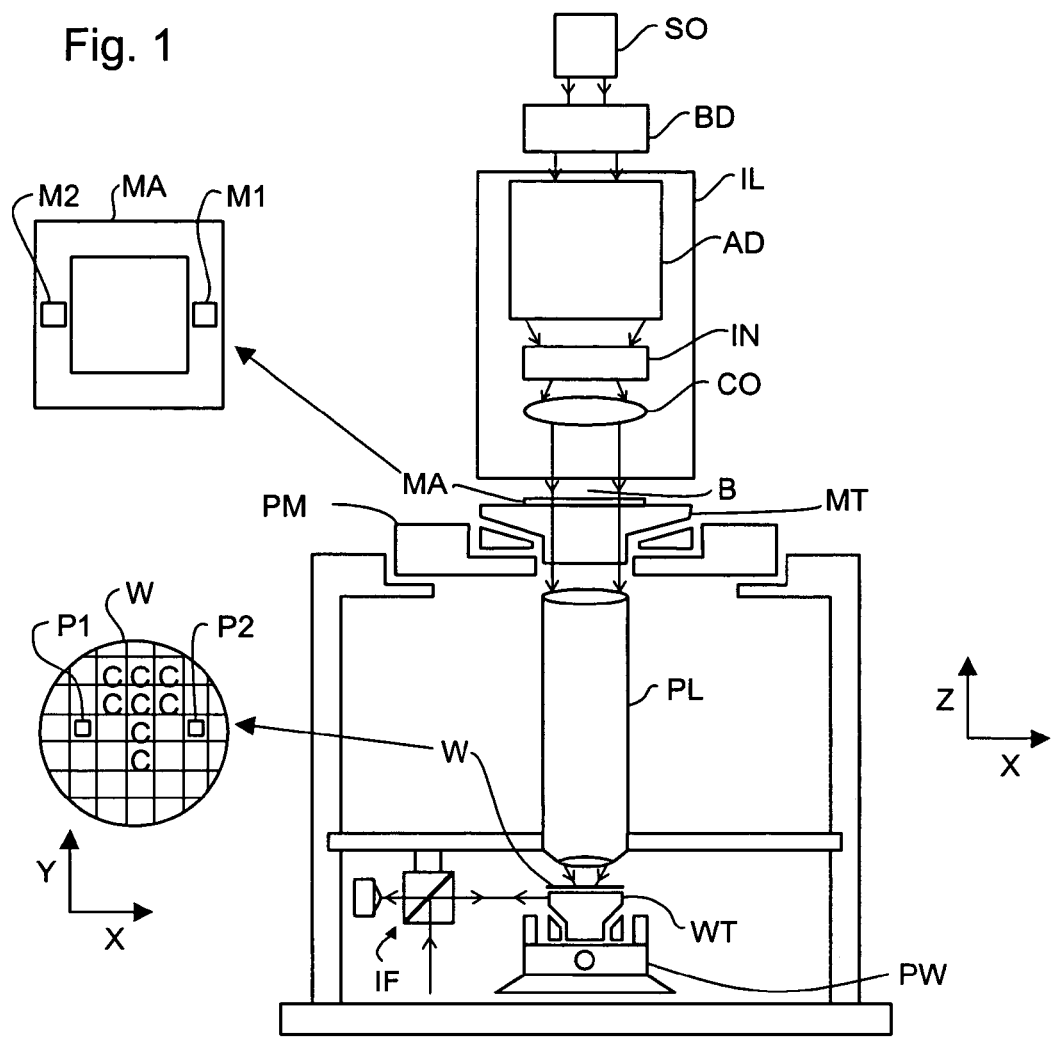
FIG. 1 depicts a lithographic apparatus, according to an embodiment of the invention.

FIG. 1 schematically depicts a lithographic apparatus, according to one embodiment of the invention. The apparatus comprises an illumination system IL, a support structure MT, a substrate table WT, and a projection system PL.

The illumination system (illuminator) IL is configured to condition a radiation beam B (e.g., UV radiation or DUV radiation).

The support structure (e.g., a mask table) MT is constructed to support a patterning device (e.g., a mask) MA and connected to a first positioner PM configured to accurately position the patterning device MA in accordance with certain parameters.

The substrate table (e.g., a wafer table) WT is constructed to hold a substrate (e.g., a resist-coated wafer) W and connected to a second positioner PW configured to accurately position the substrate W in accordance with certain parameters.

The projection system (e.g., a refractive projection lens system) PL configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e., bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system.

Any use of the terms "reticle" or "mask" herein may be considered synonymous with the more general term "patterning device."

The term "patterning device" used herein should be broadly interpreted as referring to any device that can be used to impart a radiation beam B with a pattern in its cross-section, such as to create a pattern in a target portion C of the substrate W. It should be noted that the pattern imparted to the radiation beam B may not exactly correspond to the desired pattern in the target portion C of the substrate W, for example, if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of patterning devices MA include, but are not limited to, masks, programmable mirror arrays, and programmable LCD panels.

Masks are well known in lithography, and include mask types, such as binary, alternating phase-shift, and attenuated phase-shift, as well as various hybrid mask types.

An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including, but not limited to, refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (e.g., dual stage) or more substrate tables WT (e.g., two or more mask tables). In such "multiple stage" machines the additional tables WT may be used in parallel, or preparatory steps may be carried out on one or more tables WT, while one or more other tables WT are being used for exposure.

The lithographic apparatus may also be of a type wherein at least a portion of the substrate W may be covered by a liquid having a relatively high refractive index (e.g. water) so as to fill a space between the projection system PL and the substrate W. An immersion liquid may also be applied to other spaces in the lithographic apparatus, for example, between the mask MA and the projection system PL. Immersion techniques are well known in the art for increasing the numerical aperture of projection systems PL.

The term "immersion" as used herein does not mean that a structure, such as a substrate W, must be submerged in liquid, but rather only means that liquid is located between the projection system PL and the substrate W during exposure.

With reference again to FIG. 1, the illuminator IL receives a radiation beam from a radiation source SO.

The source SO and the lithographic apparatus maybe separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander.

In other cases the source SO may be an integral part of the lithographic apparatus, for example when the source SO is a mercury lamp.

The source SO and the illuminator IL, together with the beam delivery system BD if required, may be referred to as a radiation system.

The illuminator IL may comprise an adjuster AD for adjusting an angular intensity distribution of the radiation beam. Generally, at least the outer and/or inner radial extent (e.g., σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section.

After passing through the illumination IL, the radiation beam B is incident on the patterning device MA, which is held on the support structure MT. The radiation beam B is patterned by the patterning device. Having traversed the mask MA, the radiation beam B passes through the projection system PL, which focuses the beam onto the target portion C of the substrate W.

With the aid of the second positioner PW and position sensor IF (e.g., an interferometric device, linear encoder, capacitive sensor, etc.), the substrate table WT can be moved accurately, so as to position different target portions C in the path of the radiation beam B, for example.

Similarly, the first positioner PM and another position sensor (not shown) can be used to accurately position the mask MA with respect to the path of the radiation beam B, after mechanical retrieval from a mask library, or during a scan, for example.

In general, movement of the mask table MT may be realized with the aid of a long-stroke module (e.g., coarse positioning) and a short-stroke module (e.g., fine positioning), which form part of the first positioner PM.

Similarly, movement of the substrate table WT may be realized using a long-stroke module and a short-stroke module, which form part of the second positioner PW.

In the case of a stepper, as opposed to a scanner, the mask table MT may be connected to a short-stroke actuator only, or may be fixed.

Mask MA and substrate W may be aligned using mask alignment marks M1, M2 and substrate alignment marks P1, P2. Although the substrate alignment marks as illustrated occupy dedicated target portions, they may be located in spaces between target portions (e.g., scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously, while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the mask table MT is kept essentially stationary holding a programmable patterning device MA, and the substrate table WT is moved or scanned while a pattern imparted to the radiation beam B is projected onto a target portion C. In this mode, generally a pulsed radiation source SO is employed and the programmable patterning device MA is updated as required after each movement of the substrate table WT or in between successive radiation pulses during a scan. This mode of operation can be readily applied to maskless lithography that utilizes programmable patterning device MA, such as a programmable mirror array of a type as referred to above.

Combinations and/or variations on the above described modes of use or entirely different modes of use may also be employed.

Figure 2:
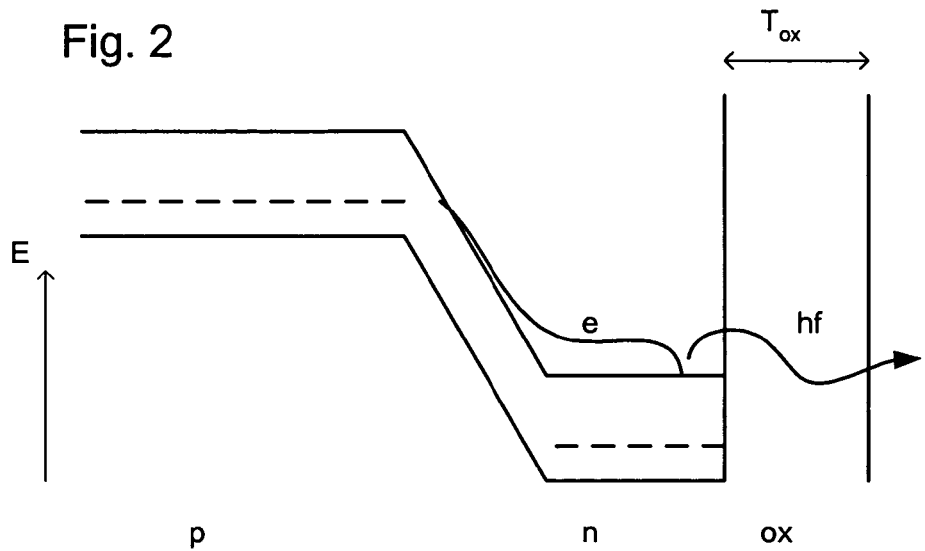
FIG. 2 is an energy level diagram of the light source of the apparatus of FIG. 1.

FIG. 2 is an energy level diagram of a reverse-biased pn-junction that is used as the radiation source SO, in one embodiment of the present invention. Such a radiation source SO has a low operating voltage, a high switching speed, and provides great design freedom. High intensity can be provided by the use of large or multiple sources, for example.

The pn-junction can be doped with impurities to increase emission of radiation at a desired frequency, and hence increase the efficiency of the device. For protection, the pn-junction may covered by a layer of transparent oxide.

By reverse biasing the pn-junction with a potential difference of at least 4V, or in one example 5V, radiation of wavelength 300 nm or less can be obtained. In one example, the potential difference should be as high as can be tolerated by the device so as to produce radiation of as short a wavelength as possible.

A filter for selecting a desired range of wavelengths from the radiation emitted by said pn-junction may be used to create a (quasi-)monochromatic source.

In one example, the radiation source SO comprises a plurality of selectively addressable elements, each element comprising a pn-junction as hereinbefore defined. This provides a spatially addressable light source SO, which may be used for control of the illumination of a lithographic projection apparatus or as a patterning means MA in a lithographic apparatus.

In this embodiment, the pn-junction is shallow and covered by a thin layer of transparent oxide ox, e.g., with a thickness $T_{ox}$ of about 20 nm. The n-type region n is nearer the surface. When the junction is reverse-biased by a voltage source (not shown) with a potential difference of about 5V, broadband radiation is emitted. This occurs because there is an avalanche breakdown leading to electrons being accelerated into the n-type region where they decelerate and emit "bremstrahlung" (braking radiation). The emitted radiation is a continuous spectrum with a lower cut-off wavelength determined by the energy of the electrons, as follows:

$$\lambda_{min} = \frac{hc}{U} = \frac{1.24*10^{-6}}{U} \qquad (1)$$

where $\lambda_{min}$ is the lower cut-off wavelength, c is the speed of light, h is Planck's constant and U is the potential difference across the junction.

Thus, in one example a potential difference of 5V can generate radiation at 248 nm. In one example, by including appropriate impurities in the junction, peaks in the emission spectrum can be created, so that the efficiency of emission at a desired wavelength can be increased. In one example, filters can be used to select a desired wavelength band for use to form the beam. In various examples, the power of the device can be increased by increasing its area and/or by the use of an array of sources SO. The latter arrangement also enables power control by selective application of some or all sources SO in the array. In one example, electrode and addressing schemes used in displays can be used to selectively activate individual sources in the array.

Figure 3:
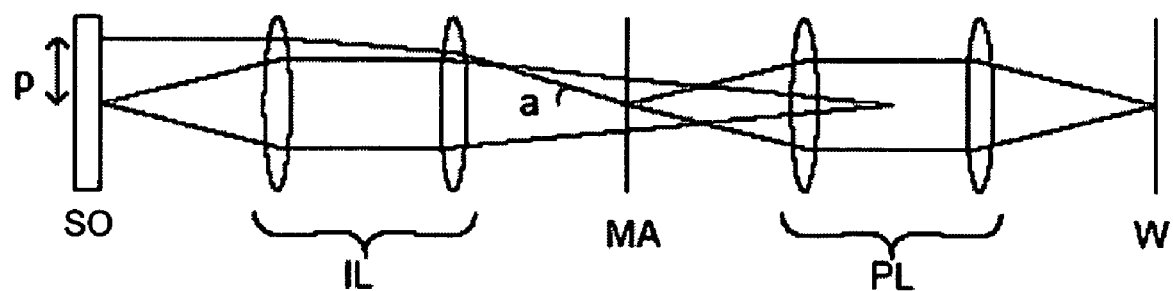
FIG. 3 is a schematic diagram of the optical arrangement of a lithographic apparatus, according to an embodiment of the invention.

FIG. 3 shows an array of sources SO used to allow for control of an angle of illumination impinging on a patterning means MA, according to one embodiment of the present invention.

In the Kohler illumination arrangement, the illumination system IL is arranged to image a secondary light source onto a pupil plane of the projection system PL. The secondary light source is located in a plane of the illumination system IL, which is a Fourier transform of the mask plane, which in turn is the object plane of the projection system PL. With such an arrangement, the angular distribution of the radiation illuminating the mask MA is determined by the spatial distribution of the light in the secondary light source. Various means, such as zoom-axicons, masks, diffractive optical elements, and optical fiber guides, have been used to define the spatial distribution of light in the secondary light source.

According to this embodiment of the invention, a light source SO formed by an array of individually switchable reverse-biased pn-junctions as described above, each pn-junction forming in effect a pixel, is placed at the object plane of the illumination system IL and the mask (or other patterning means) MA is placed at a pupil plane of the illumination system IL. The image plane of the illumination system IL is arranged to be coincident with a pupil plane of the projection system PL. In effect, Kohler illumination is achieved with the primary light source, formed of an array of reverse-biased pn-junctions, at a plane that is a Fourier transform of the mask plane. Any desired angular illumination distribution a at the mask MA can therefore be obtained by selective energizing of pixels of the light source SO having a spatial distribution p. The angular distribution a can therefore be set to any desired amount, allowing optimization of illumination for every exposure with no throughput loss, nor the delay and expense required for the manufacture of custom diffractive optical elements.

Figure 4:
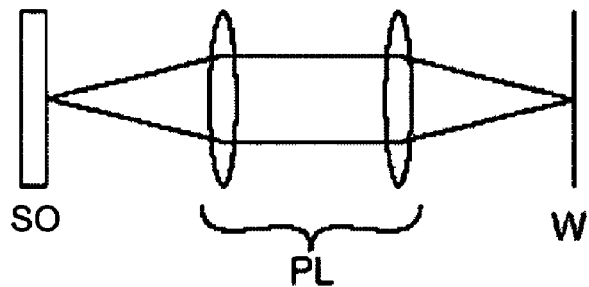
FIG. 4 is a schematic diagram of the optical arrangement of a lithographic apparatus, according to an embodiment of the invention.

FIG. 4 shows an array of reverse-biased pn-junctions used as a patterning device MA, according to one embodiment of the present invention. The patterning device MA consists of an array of individually addressable pixels, each formed by a reverse-biased pn-junction arranged to emit UV or DUV radiation, as described above. Each junction can be regarded as a pixel. By selective activation of the pixels of patterning device MA, a mask pattern can be displayed on the patterning device MA through a contrast between pixels that are ON, i.e., emitting radiation, and those pixels that are OFF, not emitting radiation. This image can then be projected onto the substrate W to expose a radiation-sensitive layer thereon with the mask pattern.

The projection system PL may have a magnification of ¼ or ⅕ or less so that a pattern having a minimum feature size of less than about 250 nm can be projected from a patterning means MA with a pixel size of about 1 µm$^2$ or less.

If reduction of the mask pattern is not necessary, the projection system PL may be omitted and the lithography apparatus configured as a simple contact, or near contact printer.

Although specific reference maybe made above to the use of lithographic apparatus in the manufacture of ICs, it should be understood that the lithographic apparatus described herein may have other applications. For example, other applications can be, but are not limited to, the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure in, for example, a track (e.g., a tool that typically applies a layer of resist to a substrate and develops the exposed resist), a metrology tool, and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may be been made above to the use of embodiments of the invention in the context of optical lithography, it will be appreciated that the invention may be used in other applications. Another application can be, but is not limited to, imprint lithography, and where the context allows, is not limited to optical lithography.

In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5–20 nm), as well as particle beams, such as ion beams or electron beams.

The term "lens," where the context allows, may refer to any one or combination of various types of optical components, including refractive, reflective, magnetic, electromagnetic and electrostatic optical components.

CONCLUSION

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic, or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
   a radiation source including a plurality of selectively addressable pn-junction elements, the radiation source generating patterned radiation through selective addressing of the plurality of selectively addressable pn-junction elements; and
   a projection system that projects the patterned radiation generated by the radiation source onto a target portion of a substrate.

2. The lithographic apparatus of claim 1, wherein each of the pn-junction elements is doped with impurities to increase emission of radiation at a desired frequency.

3. The lithographic apparatus of claim 1, wherein each of the pn-junction elements is covered by a layer of transparent oxide.

4. The lithographic apparatus of claim 1, further comprising:
   a voltage source that provides a potential difference of at least about 4V to reverse bias selectively addressed ones of the pn-junction elements.

5. The lithographic apparatus of claim 1, further comprising:
   a voltage source that provides a potential difference of about 5V to reverse bias selectively addresses ones of the pn-junction elements.

6. The lithographic apparatus of claim 1, further comprising:
   a filter that selects a desired range of wavelengths from the radiation emitted by selectively addresses ones of the pn-junction elements.

7. A lithographic method used to manufacture a device, comprising:
   selectively addressing an array of pn-junction elements to form a patterned beam of radiation; and
   projecting the patterned beam of radiation onto a target portion of a substrate.

8. The method of claim 7, further comprising:
   doping the pn-junction elements with impurities to increase emission of radiation at a desired frequency.

9. The method of claim 7, further comprising:
   covering the pn-junction elements with layer of transparent oxide.

10. The method of claim 7, further comprising:
    providing a potential difference of at least about 4V to reverse bias the selectively addresses ones of the pn-junction elements.

11. The method of claim 7, further comprising:
    providing a potential difference of about 5V to reverse bias the selectively addresses ones of the pn-junction elements.

12. The method of claim 7, further comprising:
    filtering a desired range of wavelengths from the radiation emitted by the selectively addressed pn-junction elements.

* * * * *